(12) United States Patent
Hartmann et al.

(10) Patent No.: US 8,865,394 B2
(45) Date of Patent: Oct. 21, 2014

(54) SELF-ALIGNED COVERAGE OF OPAQUE CONDUCTIVE AREAS

(75) Inventors: Sören Hartmann, Baesweiler (DE); Christoph Rickers, Aachen (DE); Herbert Friedrich Boerner, Aachen (DE); Herbert Lifka, Son (NL); Holger Schwab, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 27 days.

(21) Appl. No.: 13/816,251

(22) PCT Filed: Jul. 29, 2011

(86) PCT No.: PCT/IB2011/053382
§ 371 (c)(1),
(2), (4) Date: Feb. 11, 2013

(87) PCT Pub. No.: WO2012/025847
PCT Pub. Date: Mar. 1, 2012

(65) Prior Publication Data
US 2013/0146859 A1 Jun. 13, 2013

(30) Foreign Application Priority Data
Aug. 23, 2010 (EP) .................... 10173728

(51) Int. Cl.
*H01L 21/70* (2006.01)
*G03F 7/20* (2006.01)
*H01L 51/52* (2006.01)
*H01L 51/00* (2006.01)

(52) U.S. Cl.
CPC .......... *H01L 21/707* (2013.01); *H01L 51/5212* (2013.01); *H01L 51/00* (2013.01)
USPC ........................................ 430/311

(58) Field of Classification Search
CPC ... H01L 51/5212; H01L 21/707; H01L 51/00; G03F 7/20
USPC ...................... 430/311; 257/40; 438/584, 760
See application file for complete search history.

(56) References Cited

U.S. PATENT DOCUMENTS

| 6,320,312 | B1 * | 11/2001 | Kim et al. ..................... 313/506 |
| 2004/0085489 | A1 * | 5/2004 | Hayase et al. .................. 349/43 |
| 2009/0166612 | A1 | 7/2009 | Cain et al. |

FOREIGN PATENT DOCUMENTS

| EP | 2131629 A1 | 12/2009 |
| WO | 2010034815 A1 | 4/2010 |

*Primary Examiner* — Brittany Raymond
(74) *Attorney, Agent, or Firm* — Meenakshy Chakravorty

(57) ABSTRACT

The invention relates to a method enabling to apply cheap manufacturing techniques for producing reliable and robust organic thin film device (EL) comprising the steps of providing (P) a transparent substrate (1) at least partly covered with a first layer stack comprising at least one transparent layer (2), preferably an electrically conductive layer, and a pattern of first and second opaque conductive areas (31, 32) deposited on top of the transparent layer (2), depositing (D) a photoresist layer (4) made of an electrically insulating photoresist resist material on top of the first layer stack at least fully covering the second opaque conductive areas (32), illuminating (IL) the photoresist layer (4) through the transparent substrate (1) with light (5) of a suitable wavelength to make the photoresist material soluble in the areas (43) of the photoresist layer (4) having no opaque conductive areas (31, 32) underneath, removing (R) the soluble areas (43) of the photoresist layer (4), heating (B) the areas (42) of the photoresist layer (4) remaining on top of at least the second opaque conductive areas (32) to re-flow the photoresist layer (4) to cover the edges (E) of the second opaque conductive areas (32) in contact to the transparent layer (2), and hardening (H) the remaining areas (42) of the photoresist layer (4). The invention further relates to a conductive component (CC) for use in these organic thin film devices (EL) and to the organic thin film devices (EL) itself.

13 Claims, 5 Drawing Sheets

(a)

(b)

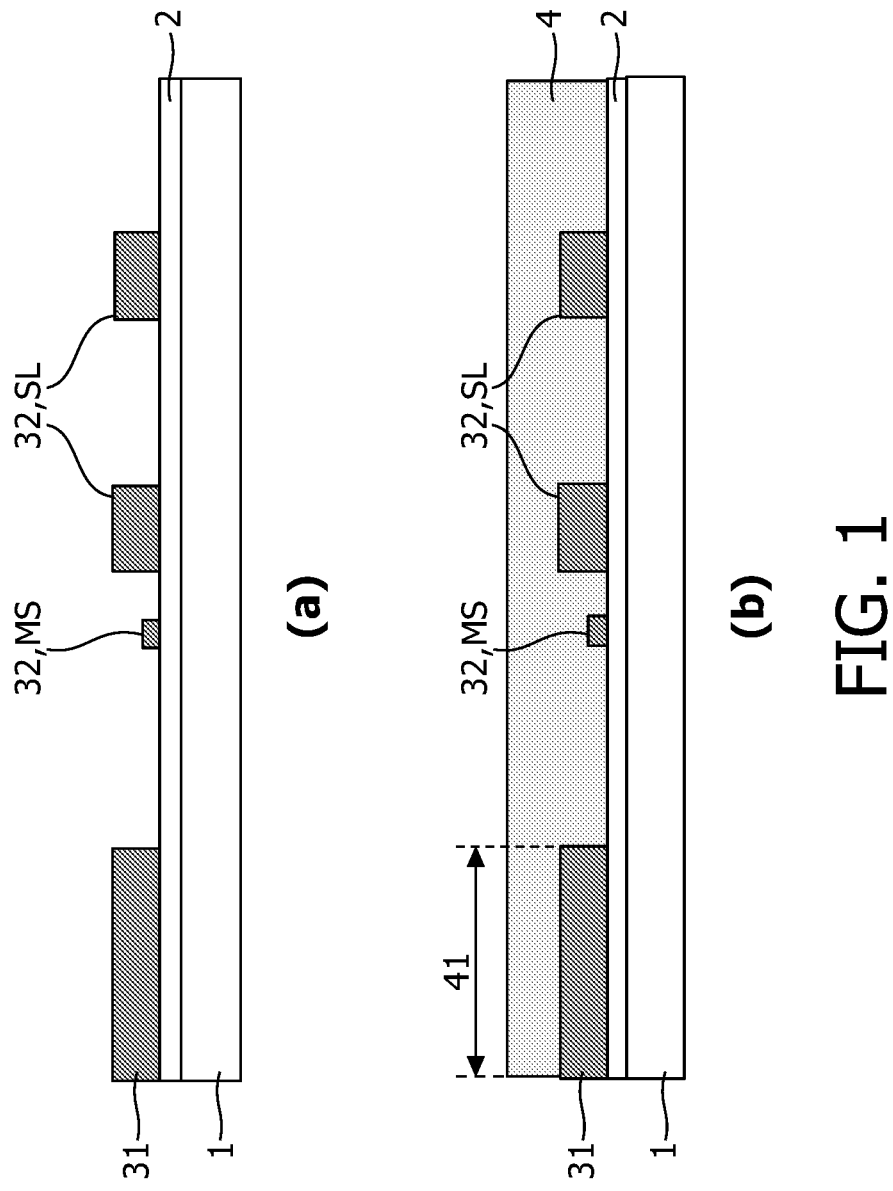

SELF-ALIGNED COVERAGE OF OPAQUE CONDUCTIVE AREAS

FIELD OF THE INVENTION

The invention relates to the field of covering opaque conductive areas in a self-aligned process, a method to execute the self-aligning coverage and an organic thin film device manufactured with this method

BACKGROUND OF THE INVENTION

Organic thin film devices, especially organic electroluminescent devices or organic photo voltaic devices comprise multiple structured layers such as electrodes or shunt lines (sometimes also denoted as mesh lines) deposited on top of the electrodes to distribute the current without significant losses over a large electrode area. Existing manufacturing processes rely on masked deposition and/or lithography processes in order to provide structured layers. The use of masks requires large preparation (each structure requires an individual mask) and process control effort (accurate mask-substrate alignments mandatory) and is therefore a quite expensive process. Furthermore, accurate structures also require an expensive tool for high resolution lithography. Therefore, a demand for reducing the manufacturing costs exists. Self-aligned deposition of layers are known from document WO 2010/034815 A1, where electrically conductive metal structures for transistor devices are created using photoresist layers and shielding structures deposited prior to the photoresist layer. During the irradiation process for the photoresist layer, the shielding structures acts as a mask and corresponding conductive metal pattern could be created in the areas outside the shielded areas.

In contrast to transistor devices, organic electroluminescent devices (OLEDs) and/or organic photovoltaic devices are large area devices. Roll-to-roll processing is a promising manufacturing technique for organic thin film devices for reducing the manufacturing costs, where masks are widely replaced by alternative processes like laser deposition, laser ablation, photo-lithography and/or printing technologies. However, the applied structuring technologies lead to geometries of the particular layers being not as accurate as present in case of masked deposition and/or the occurrence of particles or small material areas adjacent to the desired structures (so-called satellite structures) increases. Especially the occurrence of small metal satellite areas outside the desired metal areas is a critical and non-avoidable effect increasing the risk of shorts between the layers. Metal particles or metal areas outside the desired deposition location and/or with a non-smooth shape will shorten the lifetime of organic thin film devices due to occurring shorts during the operation of these devices. Applied cleaning steps to remove the satellite areas require a very high effort due to the non-regular pattern and non-predictable position of such non-desired metal areas, which could be very small, eventually non visual to human eyes. Aggressive cleaning steps may be able to remove metal satellites, but would also negatively affect the intended metal deposition areas. Passivation of satellites with additional layer coated on top is often not applicable due to the wide and random spread of satellites, their hardly detectable position and their small, sometimes non-visual size. Additionally deposition processes like printing technologies provide desired layers but with irregular shapes or frayed edges requiring an electrical passivation as well to avoid shorts. A reliable passivation of areas with non-straight borders using mask technologies for applying the passivation layers will result in passivated areas larger than theoretical necessary and/or uncovered areas. Due to the non accurate structures, mask coating of the printed structures is difficult and may lead to a waste of functional area, e.g. to generate light.

SUMMARY OF THE INVENTION

It is an object of the invention to provide a method enabling to apply cheap manufacturing techniques for producing reliable, robust and well performing organic thin film device with high brightness.

This object is achieved by a method for covering opaque conductive areas in a self-aligned process comprising the steps of providing a transparent substrate at least partly covered with a first layer stack comprising at least one transparent layer, preferably an electrically conductive layer, and a pattern of first and second opaque conductive areas deposited on top of the transparent layer, depositing a photoresist layer made of an electrically insulating photoresist material on top of the first layer stack at least fully covering the second opaque conductive areas, illuminating the photoresist layer through the transparent substrate with light of a suitable wavelength to make the photoresist material soluble in the areas of the photoresist layer having no opaque conductive areas underneath, removing the soluble areas of the photoresist layer, heating the areas of the photoresist layer remaining on top of at least the second opaque conductive areas to re-flow the photoresist layer to cover the edges of the second opaque conductive areas in contact to the transparent layer, and hardening the remaining areas of the photoresist layer.

Organic thin film devices denote devices with a stack of thin films comprising at least one organic layer. Examples of organic thin film devices are organic photovoltaic devices and organic electroluminescent devices. A self-aligning process denotes a process, where present structures within a layer stack are used to process further structures without applying external masks. The term "transparent" denotes a material or layer at least transparent to visible light. The substrate and/or the transparent layer on top of the substrate may be transparent in additional spectral ranges (e.g. <400 nm) depending on the material properties of substrate and layer. Suitable substrate materials are for example glass, PMMA (polymethyl methacrylate) PET (polyethylene terephthalate), PEN (polyethylene nafthalate) or polyimide. The size of the substrate may vary orders of magnitude depending on the application of the resulting device. The transparent layer deposited on top of the substrate may be deposited directly on top of the substrate. Alternatively there may be additional layers between the transparent layer and the substrate, e.g. for increasing the light output from the functional layer stack into the substrate in case of OLEDs. Suitable materials for the transparent layers are for example transparent conductive oxides (TCOs) such as indium-tin-oxide (ITO). Alternatively thin metal layers with thicknesses less than 20 nm may also be used to provide transparent conductive layers used as the transparent layer. The maximum thickness required to maintain a sufficient transparency depends on the used material and deposition process. The sheet resistance of ITO layer of 130 nm is typically in the order of 20Ω/. Suitable deposition techniques for depositing the transparent layer are for example evaporation, sputtering, CVD or SolGel processes. The term "conductive" denotes electrically conductive materials. The material deposited on top of the transparent layer to provide opaque conductive areas could be any kind of electrically conductive material being non-transparent at least in the visible and/or UV range of the wavelength spectrum. As an example suitable conductive opaque materials are metals, e.g. aluminum, gold, silver, titan etc. The opaque conductive areas can be structured as desired for the particular layer stack. As an example the opaque conductive areas may provide electrical paths with high conductivity, e.g. opaque conductive areas as metal areas establishing shunt lines (or mesh lines) to distribute the electrical current without significant losses over the conductive transparent layer underneath being in electrical contact to the shunt lines. The first opaque conductive areas may require an electrical passivation to avoid negative electrical effects such as shorts, e.g. caused by the edges of these first opaque conductive areas, if the first opaque conductive areas are partly covered by the subsequent layers as part of the functional layer stack. As an example first opaque conductive areas might be contact pads for connecting the conductive transparent layer to an external power source, e.g. via a cable welded to the contact pad. The second opaque conductive areas denote the areas, which are desired opaque conductive areas (e.g. shunt lines) and so-called satelite opaque conductive areas resulting from the applied deposition/structuring technique. The satelite areas are non-desired opaque conductive areas. Also the second opaque conductive areas require an electrical passivation before applying the next layers on top to avoid negative electrical effects such as shorts, e.g. caused by the edges of these first opaque conductive areas. The term "layer stack" denotes a sequence of layers applied at least locally on top of each other. A layer stack comprises at least two layers. The first and second opaque conductive areas may be applied by one or more deposition technologies such as evaporation, sputtering, laser metal transfer process in case of metal as the opaque conductive material, printing such as ink jetting, gravure, flexo printing, screen printing or by structuring of a previously deposited layer using laser ablation. In an embodiment the deposition of the pattern of second opaque conductive areas is performed by laser deposition or printing pattern of second opaque conductive areas directly on top of the transparent layer and/or by removing the second opaque conductive material locally from a second opaque conductive layer deposited on top of the transparent layer using laser ablation or etching. Cheap deposition processes are preferred. Cheap deposition processes are for example printing processes like ink jet printing or a metal transfer process applying a laser ablating material from a metal sheet placed above the to-be-coated transparent layer. Unfortunately, these cheap processes lead to satellite areas as second opaque conductive areas adjacent to the desired second opaque conductive areas. Furthermore this process may lead to edges of the desired second opaque conductive areas, which do not follow a straight line along the second opaque conductive area even if a rectangular second opaque conductive area is the desired shape of this area. The deviation from such a straight line depends on the process parameters for the applied laser transfer process. With the method according to the present invention, the cheap processes become available for manufacturing reliable, robust and well performing organic thin film devices.

The deposition of the photoresist layer may be performed with any deposition technology suitable to deposit a photoresist material as a layer on top of a structured layer stack comprising a transparent layer and first and second opaque conductive areas. As an example the step of depositing the photoresist layer is performed by slit coating, spin coating, slot-die coating, ij-printing (ink jet printing), screen printing, gravure, or flexo printing. Preferably the step of depositing the photoresist layer is performed by locally printing the photoresist layer on top of the second opaque conductive areas and parts of the transparent layer, preferably by adaptive slit coating, screen printing, ink-jet printing gravure or flexo printing. The photoresist layer may also fully cover the first opaque conductive areas. Alternatively a local deposition of the photoresist layer enables to leave the first opaque conductive areas at least partly uncoated (if possible) for avoiding any cleaning step required for further processing the first opaque conductive areas, e.g. applying contacts to the first opaque conductive areas in order to apply a driving voltage to the first opaque conductive areas. The photoresist material is a light-sensitive material and can be classified in two groups, positive and negative photoresists. In order to be able to electrically insulate conductive areas against layers deposited on top of the photoresist material, the photoresist material has to be non-conductive. The preferred material is a positive photoresist, where the portion of the photoresist that is exposed to light becomes soluble and therefore is removable in a later performed removal step (so-called developing) while the portion of the photoresist that is unexposed remains insoluble and will stick to the areas where deposited. For example, suitable positive photoresist materials might be AZ 1518, e.g. from Clariant, or HPR 504, e.g. from Fujifilm. Both photoresist materials enables deposition of photoresist layer of thicknesses up to 2-2.5 µm with good adhesion properties. People skilled in the art may apply other suitable photoresist materials for depositing the photoresist layer within the scope of the present invention. As an example, after spin-coating of AZ 1518 at 300 rpm and a softbake step of 30 min at 90° C., an AZ 1518 photoresist layer of 2.05 µm could be obtained. As another example, an AZ 1518 layer of 2.0 µm thickness might be printed on top of the layer stack. The deposition conditions for other photoresist materials may be adapted to the desired layer thickness of the photoresist layer. The layer thickness of the photoresist layer has to be adapted in order to cover at least all second opaque conductive areas (and eventually the first opaque conductive areas), since the thickness of the remaining photoresist material provides the material reservoir for the reflow process. The thicknesses of the first/second opaque conductive areas might be in the order of one micrometer.

The self-aligning process to cover at least the second opaque conductive areas is achieved by illuminating (exposing) the photoresist layer with light from the substrate side (=through the substrate). Here the illuminating light source is placed in front of the substrate side, where the side of the substrate facing away from the light source comprises the layer stack on top of this side. Therefore the light to illuminate the photoresist layer first penetrates the transparent substrate, then the transparent layer and enters the photoresist layer, where no first and/or second opaque conductive areas are present on top of the transparent layer. The present first and second opaque conductive areas absorb the light or in case of metal areas as the opaque conductive areas the metal areas reflect the light and therefore shield the photoresist layer on top of the first and/or second opaque conductive layers from light exposure. The term "underneath" denotes the location between transparent layer and photoresist layer in the direction of the light propagation direction of the illuminating light. Therefore the angle of incident of the illuminating light to the substrate (angle between light illumination direction and the surface of the substrate) should be close to 90° C. to avoid any misalignment between existing opaque conductive structures and the locally illuminated photoresist layer. The wavelength of the light suitable to illuminate (expose) the photoresist layer depends on the applied photoresist material. Since the transparency outside the visual range of the light spectrum may vary for different the transparent substrates, the suitable photoresist materials may have to be adapted to the applied transparent substrate. E.g. substrates made of sodalime-glass are non-transparent for parts of the wavelengths of the UV-spectrum. On the other hand Al-silicate glasses are transparent for wavelength within the UV-spectrum. In case of plastic substrates, the transparency for shorter wavelength may also differ. As an example, a photoresist layer made of HPR 504 is exposed by a UV lamp (G-line 436 nm) followed by a post exposure baking step at 95° C. Other photoresist material may be exposed to light with wavelengths of i-, h- g-lines ranging from 310-440 nm. The wavelength spectrum might be a line spectrum or a broad band spectrum. The step of illuminating the photoresist may comprise two steps of exposing the photoresist to light.

After a photoresist is no longer needed, it must be removed from the substrate. The areas of the photoresist layer exposed (illuminated) to said suitable light have to be removed, because these area do not comprise first and/or second opaque conductive areas underneath, therefore a photoresist layer present at these areas will e.g. prevent the application of a driving voltage from the transparent conductive layer to the subsequent layer to be coated on top of the transparent conductive layer. To remove the photoresist the illuminating step (light exposure) is followed by a removing step (or developing step). The illuminated areas of the photoresist are soluble in a developer material. Applying a developer material to the photoresist will remove the illuminated areas from the transparent layer. The non-illuminated areas of the photoresist will remain on top of the first and second opaque conductive areas. After the removing step, the areas still coated with photoresist material are only on top of the first and/or second opaque conductive areas. Suitable developer materials, e.g. for AZ 1518, are for example AZ® 351B 1:4, AZ® 726MIF, AZ® 400K 1:4 or AZ® 326MIF. The developer materials may vary for other photoresist material. People skilled in the art are able to choose suitable illumination wavelengths and developer materials within the scope of the present invention. Alternatively the photoresist material may be removed from these areas by a plasma containing oxygen, which oxidizes it. This process is called ashing, and resembles dry etching or the step of removing the illuminated (soluble) areas of the photoresist layer is performed by a wet chemical lithography or a jetting process. This of course has to be done locally for which several options exist, e.g. etching with a shadow mask or etching with a local plasma tool. In an alternative method to remove photoresist or in addition to previous methods, a liquid "resist stripper" chemically altering the photoresist so that it no longer adheres to the substrate could be applied.

After removing the photoresist material from the areas of the photoresist layer exposed (illuminated) with said light, the remaining photoresist material on top of the first and/or second opaque conductive areas still does not sufficiently cover the edges of at least the second opaque conductive areas in contact to the transparent layer. Therefore the photoresist material is heated in order to suitably soften it in order to start a reflow process leading to a full coverage of the edges of the second opaque conductive areas (and eventually the first opaque conductive areas) in contact to the transparent layer. The term "reflow" denotes a photoresist layer starting to slightly flow downwards along a topography. To achieve a suitable reflow (e.g. depending on surface tension of the applied photoresist), the material has to be heated in order to decrease its viscosity and therefore to become fluid again. However, the parameters of the reflow process have to be adapted in order to limit the reflowing of the photoresist material to just covering the edges of the second opaque conductive areas but preventing the coverage of previously cleaned areas of the transparent layer, where no coverage is required. In case of organic electroluminescent devices (OLED), any coverage of the transparent layer will result in a reduced overall brightness of the OLED. Therefore the coverage of the edges of the second opaque conductive areas will be limited to the required extend. The heating might be performed at any suitable temperature for a duration of a few tens of minutes to achieve a reflow suitable to cover an area around the second opaque conductive areas of a lateral extension in the order of one or a few micrometers, which will sufficiently cover the edges of the second opaque conductive areas in contact to the transparent layer. In an embodiment the step of heating is performed at peak temperatures above 100° C., preferably above 130° C., even more preferred above 160° C. At these temperatures, photoresist materials show a suitable reflow behavior. As an example, the heating might be performed at 200° C. for duration of 30 min to achieve an even more suitable reflow. In another embodiment the heating step is adjusted in order to achieve a reflow of the photoresist layer suitable to cover an area of the transparent layer with extension of more than 100 nm around the edge of the second opaque conductive areas, preferably up to 2 µm, more preferably between 200 nm and 1 µm. Common area sizes of the second opaque conductive areas in case of shunt lines are about 5 µm times 50 cm, but may extend in the future to 5 µm times 3 m. The lateral extension of the second opaque conductive areas of 5 µm covered by a approximately 2 µm photoresist layer provides enough photoresist material suitable to reflow up to a few micrometer on top of the transparent layer still covering the second material areas as a contiguous layer of photoresist material.

After a finished reflow process the present occupied areas have to be stabilized in order to be able to deposit additional layers on top of the present layers. The so-called hardening of the photoresist material now covering the second opaque conductive areas as well as the edges of the second opaque conductive areas extending slightly on top of the transparent layer might be performed at temperatures below the heating temperatures. Hardening conditions for the photoresist materials are known from skilled people. In an embodiment the step of hardening the remaining areas of the photoresist layer is performed simultaneously with the heating step in order to save process time.

In another embodiment the method further comprises the step of additionally exposing the first opaque conductive areas with light in order to be able to remove the photoresist layer partly from the first opaque conductive areas. The first opaque conductive areas outside the functional layer stack are intended to contact the electrodes and therefore photoresist material has to be removed from these parts of the first opaque conductive areas. As an example, the additional exposing step might be performed by local laser exposure or masked exposure of the photoresist material on top of the first opaque conductive areas from the photoresist side with a suitable wavelength to make the exposed photoresist soluble in the developer material. However, the areas of the first opaque conductive areas as part of the later established functional layer stack still have to be covered with photoresist material in order to electrically passivate at least the edges of the first opaque conductive areas. In order to remove the exposed photoresist on top of the first opaque conductive areas, the additional exposing step is performed before the step of removing. When applying a developer material, also these photoresist areas will be removed in the same step (removing step) as the illuminated areas of the photoresist.

In another embodiment the method further comprises the steps of depositing a second layer stack at least comprising an organic layer on top of the first layer stack and the remaining areas of the photoresist layer, and depositing an electrically conductive layer on top of the second layer stack in order to provide an organic thin film device.

The covered edges of the second opaque conductive areas (and eventually the first opaque conductive areas) especially prevent shorts between the conductive transparent layer as a first electrode and the electrically conductive layer on top of the second layer stack as the second electrode originating from sharp edges and/or irregular structures with sharp contours of the second opaque conductive areas. The second layer stack may comprise one organic layer, e.g. an electroluminescent layer in case of an OLED. In other embodiments, the second layer stack may additionally comprise one or more of the group of layers comprising electron transport layer, hole transport layer, electron blocking layer, hole blocking layer, one or more electroluminescent layers, e.g. comprising a organic host material comprising organic light emitting molecules and a suitable sequence of these layers depending on the applied materials and/or the type of application. Several suitable organic layer stacks are known by people skilled in the art. In OLED devices the first and/or second opaque conductive areas are preferably metal areas to provide first and/or second opaque conductive areas with a high conductivity.

The invention further relates to a conductive component for use in organic thin film devices manufactured according to the present invention comprising a transparent substrate at least partly covered with a first layer stack comprising at least one transparent electrically conductive layer establishing a first electrode, a pattern of first and second opaque conductive areas deposited on top of the first electrode, a photoresist layer made of an electrically insulating photoresist material at least covering the second opaque conductive areas and the edges of the second opaque conductive areas in contact to the first electrode. The conductive component might be commercialized separately from an organic thin film device, e.g. an OLED device or a photovoltaic device.

The invention further relates to an organic thin film device manufactured according to the present invention comprising a transparent substrate at least partly covered with a first layer stack comprising at least one transparent electrically conductive layer establishing a first electrode, a pattern of first and second opaque conductive areas deposited on top of the first electrode, a photoresist layer made of an electrically insulating photoresist material at least covering the second opaque conductive areas and the edges of the second opaque conductive areas in contact to the first electrode, a second layer stack at least comprising an organic layer, preferably an organic electroluminescent layer, and an electrically conductive layer on top of the second layer stack establishing a second electrode. In case of first opaque conductive areas as part of the functional layer stack at least the edges of the first opaque conductive areas inside the functional layer stack are covered by the photoresist material as well. Organic thin film devices denote devices with a stack of thin films comprising at least one organic layer. Examples of organic thin film devices are organic photovoltaic devices and organic electroluminescent devices. Organic devices are large and thin area devices, which could be operated at low voltages. Organic electroluminescent devices are large area light sources providing a high brightness with a Lambertian light emission characteristic. In an embodiment of the organic thin film device the first opaque conductive area is a contact pad to connect at least one of the first electrodes or second electrodes to an external power source. The power source could be any suitable power source to provide a driving voltage in the order of a few volts to around 10 volt. In another embodiment of the organic thin film device at least parts of the second opaque conductive areas are arranged as shunting lines (or mesh lines) for the first electrode. Shunting lines support the current distribution over large electrode areas made of an electrically conductive material with limited conductivity. Without such shunt lines, the applied voltage will decrease with increasing distance from the electrical contact to the electrode and therefore the brightness will drop correspondingly. In case of large area light sources of several tens of centimeters length, shunt lines become mandatory.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
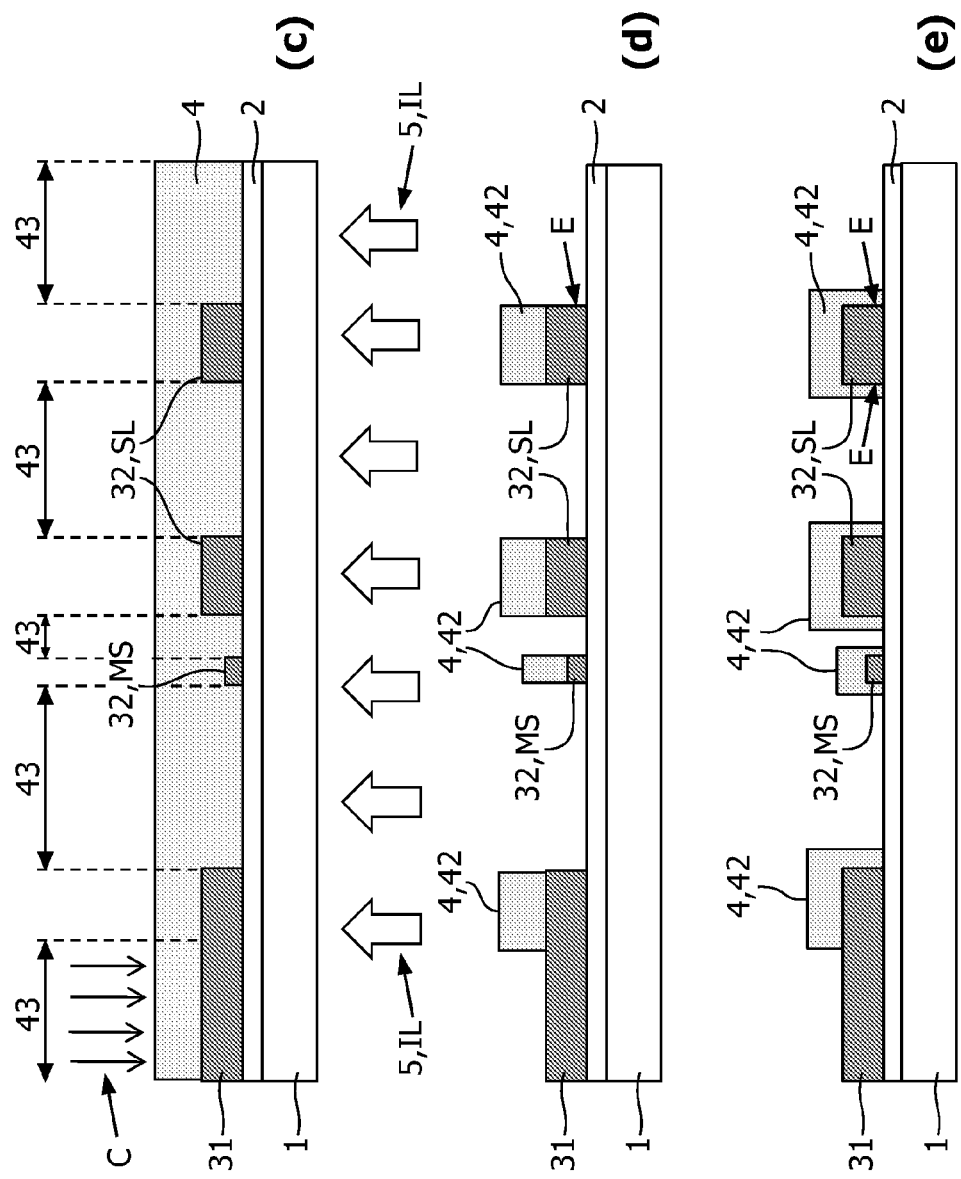
FIG. 1 shows an embodiment of the method according to the present invention to cover opaque conductive areas in a self-aligned process comprising the process steps (a)-(e).

FIG. 1 shows an embodiment of the method according to the present invention to cover opaque conductive areas in a self-aligned process comprising the process steps (a)-(e), where FIG. 1(a) shows the conductive component comprising a substrate 1, a transparent conductive layer 2 with first and second opaque conductive areas 31, 32 deposited on top of the transparent substrate 2. In this embodiment the first and second opaque conductive areas are arranged as metal areas, e.g. as aluminum areas. The first area 31 is arranged as a contact pad for contacting the conductive transparent layer 2 as one of the electrodes of the later finished organic electroluminescent device to an external power source in order to drive the organic electroluminescent device. Common thicknesses of such contact pads are 500 nm, printed silver might have a thickness of 1 μm. The first metal area 31 as the opaque conductive area could be evaporated, printed, electroplated or be deposited by material transfer from a sheet mask by later ablation. The second metal areas 32 as the opaque conductive areas might be prepared also by laser ablation to structure a previously deposited contiguous metal layer or by printing. Also in case of laser metal transfer from a sheet mask (evaporating of material from a metal sheet by laser-induced local heat) placed in short distance to the to-be-coated layers/substrate, so-called satellite metal structures 32 indicated with MS may occur in the neighborhood of the second metal areas 32 deposited as desired. In this particular embodiment, the shown second metal areas 32 in FIG. 1(a) are arranged as shunt lines indicated with SL. The satellite structures 32, MS around a desired second metal area 32 might vary in number, location and size, where the size could be very small preventing any preparation of an external mask for exclusively coating these metal satellites MS with passivating or insulating layers in order to prevent the occurrence of shorts caused by these metal satellites MS. In order to insulate these metal satellites 32, MS as well as the other first and second metal areas 31, 32 from the layers to be deposited on top of these first and second metal areas 31, 32 to finish the organic electroluminescent device, a photoresist layer 4 is deposited on top of the first and second metal areas 31, 32 and the transparent conductive layer 2 consisting of photoresist material as shown in FIG. 1(b). Typical thicknesses of the photoresist layer 4 are between 1 µm and 2.5 µm. Photoresist materials suitable to be used are for example AZ 1518, HPR 504 and many other materials. A photoresist material (or photoresist) is a light-sensitive material and can be classified in two groups, positive and negative photoresists. The material used in this method is a positive photoresist 4, where the portion 43 of the photoresist that is exposed to light 5 through the substrate 1 becomes soluble and therefore is removable in a removal step as indicated in FIG. 1(c)+(d). The portion 42 of the photoresist 4 that is unexposed remains insoluble and will stick to the areas 31, 32 where deposited, because the first and second metal areas 31, 32 are not transparent for light 5 and will therefore reflect light 5 back. Subsequently, the second metal areas 32 and the first metal areas 31 as well act as an individual mask to any photoresist material 4 deposited on top of the first and second metal areas 31, 32 without any need of designing and applying an external mask to achieve the same result. In case of first metal areas 31, the areas 43 of the photoresist layer 4 on top of these metal areas 31 will prevent and hamper the contacting of the first metal areas to a power source and therefore have to be removed partly as well. In an additional exposure step C as indicated by the thin arrows in FIG. 1(c) applied from the side of the photoresist layer 4, the photoresist 43 will be locally illuminated with light and becomes soluble and therefore is removable in the same removal step as already described for the areas 43 of the photoresist layer 4 illuminated through the substrate 2. The edges of the first metal areas 31 are not exposed to light in this additional exposure step to be passivated during the following steps. The additional exposing step C may be performed by laser exposure with a suitable wavelength prior to the removal step for the photoresist layer 43 exposed to light 5. As an example, the exposure step can be performed by a blue 405 nm solid state laser in case of HPR504 photoresist. The exposure process leads to the same photoresist properties as the illumination process to the photoresists areas with no metal areas underneath. FIG. 1(d) shows the layer structure present after the removal step of the light exposed photoresist layer 43. The second metal areas 32, SL, MS and the non-exposed parts of the first metal areas are covered by the remaining photoresist layer 42 to prevent the occurrence of short caused by these first second metal areas 31, 32. However, the edges of the first and second metal areas 31, 32 in contact to the transparent conductive layer 2 have to be covered by the photoresist material as well. After heating (baking) the layer structure for 30 min at 200° C., the remaining photoresist layer 42 will become slightly capable of flowing and will extend over the edges E as shown in FIG. 1(d) and (e). The edge E is only indicated at one second metal area 32 for ease of understanding. The same critical edges E are present at the other first and second metal areas 31, 32 also when non-indicated explicitly.

Figure 2:
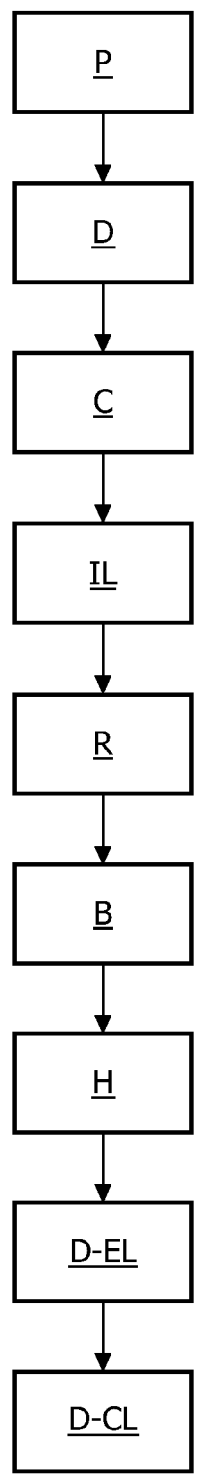
FIG. 2 shows the method steps according to the present invention.

FIG. 2 shows the steps of an embodiment of the method according to the present invention corresponding to FIG. 1, starting with providing P a transparent substrate 1 at least partly covered with a first layer stack comprising at least one transparent layer 2, preferably an electrically conductive layer, and a pattern of first and second metal areas 31, 32 deposited on top of the transparent layer 2, followed by depositing D a photoresist layer 4 made of an electrically insulating photoresist material on top of the first layer stack at least fully covering the second metal areas 32 Then the additional exposing step C of the areas on top of the first metal areas can be performed e.g. by laser exposure of these areas, followed by illuminating IL the photoresist layer 4 through the transparent substrate 1 with light 5 of a suitable wavelength to develop the photoresist material in the areas 43 of the photoresist layer 4 having no metal areas 31, 32 underneath. The additional exposing step and the illumination step through the substrate can also be switched in order, so executing step IL before step C. Then the process is followed by removing (=developing) R the illuminated or exposed areas 43 of the photoresist layer 4, followed by heating B the areas 42 of the photoresist layer 4 remaining on top of at least the second metal areas 32 to re-flow the photoresist layer 4 to cover the edges E of the second metal areas 32 in contact to the transparent layer 2, and followed by hardening H the remaining areas 42 of the photoresist layer 4. To manufacture an organic electroluminescent device capable to emit light the method further comprising the steps of depositing D-EL a second layer stack 6 at least comprising an organic electroluminescent layer on top of the first layer stack 2, 31, 32 and the remaining areas 42 of the photoresist layer 4, and depositing D-CL an electrically conductive layer 7 on top of the second layer stack 6 in order to provide an organic electroluminescent device EL.

Figure 3:
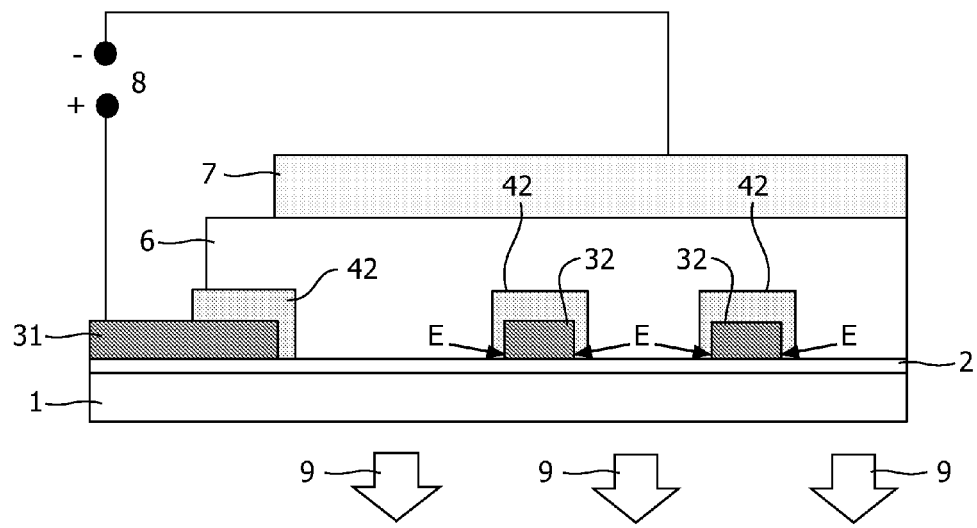
FIG. 3 shows an embodiment of an organic electroluminescent device according to the present invention.

As an example of an organic thin film device an organic electroluminescent device (OLED) is shown schematically from a side view in FIG. 3. The OLED manufactured according to method shown in FIG. 2 comprises a transparent substrate 1 at least partly covered with a first layer stack comprising at least one transparent electrically conductive layer 2 establishing a first electrode, a pattern of first and second metal areas 31, 32 deposited on top of the first electrode 2, a photoresist layer 4 made of an electrically insulating photoresist resist material covering the second metal areas 32 and the edges E of the first and second metal areas 31, 32 in contact to the first electrode 2, a second layer stack 6 at least comprising an organic electroluminescent layer, and an electrically conductive layer 7 on top of the second layer stack 6 establishing a second electrode. Here the first metal area 31 is arranged as a contact pad to connect at least one of the first electrodes 2 or second electrodes 7 to an external power source 8. The power source has to provide a driving voltage in the order of a few volts. The required current to achieve a high brightness depends on the size of the light emitting area. Since the transparent conductive material has a sheet resistance resulting in a visible voltage drop for large area OLEDs, the current is distributed over the large conductive transparent layer 2 mainly the second metal areas 32 are arranged as shunting lines SL for the first electrode 2. Large area OLED comprising shunting lines exhibit a homogeneous brightness even for large illuminating areas. Common OLEDs have to be encapsulated (sealed) to prevent oxygen and moisture penetrating into the organic layers. Therefore OLEDs may comprise a glass or metal cover lid (eventually further comprising a getter material to absorb oxygen and moisture) sealed onto the substrate. Other techniques known to the experts are also possible, e.g. thin film encapsulation. The electrical connection to the second electrode might be realized from the back side through the cover lid or the thin film encapsulation.

Figure 4:
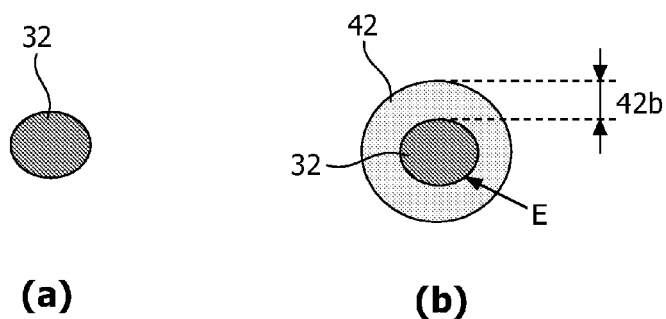
FIG. 4 shows a second opaque conductive area (a) before and (b) after the reflow process in a view through the substrate.

FIG. 4 shows a second metal area (a) before and (b) after the reflow process in a view through the substrate (not shown in details here). After the removal (R) of the photoresist material from the areas, where it is directly on top of the transparent layer and before reflowing the photoresist layer remaining on top of the second metal area 32, no remaining photoresist layer 42 is visible from the substrate side, which corresponds to no present coverage of the edge E of the second metal area 32, see FIG. 4(a). After the heating step, parts of the remaining photoresist material on top of the second metal are 32 are flowed down to the transparent layer 2 now fully covering the edge E of the second metal area 32. The parameters of the heating step might be adapted to achieve a reflow of the photoresist material to cover a certain area with a distance 42b to the edge E of the second metal area 32 in the order of a few 100 nm to a few micrometer to provide a reliable coverage of the edge E.

Figure 5:
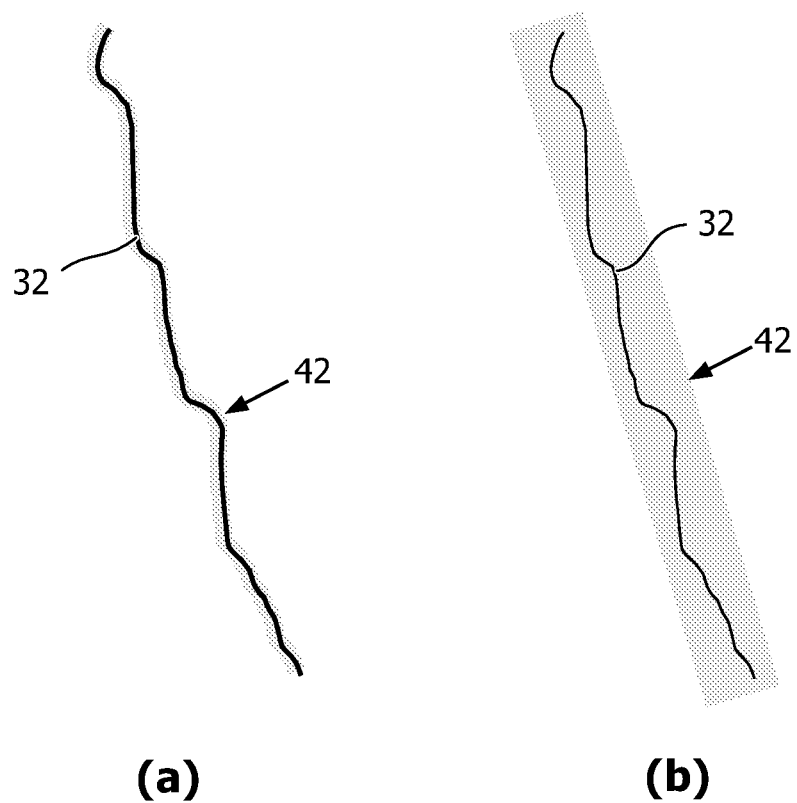
FIG. 5 shows a second opaque conductive area as a shunt line covered by photoresist material (a) according to the method of the present invention, and (b) using a mask process with an external mask.

FIG. 5 shows a second metal area 32 as a shunt line for an OLED device covered by photoresist material 42 (a) according to the method of the present invention, and (b) using a mask process with an external mask. With the self-aligned coating process of second metal areas 32 with a photoresist layer 42 according to the present invention, the coverage of the transparent layer 2 can be limited to the required minimum covered area 42, see FIG. 5(a). In case of applying an external mask as shown in FIG. 5(b), the covered area 42 would be significantly larger, because a mask following the irregular structure of the second metal area 32 is not able to be manufactured. Therefore the covered area 42 non-contributing to the light emission of the OLED is larger and subsequently the overall brightness of this OLED according to FIG. 5(b) is lower.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

LIST OF REFERENCES 1 substrate
2 transparent layer, preferably an electrically conductive layer (first electrode)
31 first opaque conductive area
32 second opaque conductive area
4 photoresist layer
41 photoresist layer on top of the first opaque conductive areas
42 areas of photoresist layer with opaque conductive underneath
42b distance between edge of the second opaque conductive areas and the outer edge of the reflowed photoresist layer area on top of the transparent layer after the heating step
43 areas of the photoresist layer having no opaque conductive underneath
5 light for developing the photoresist layer
6 second layer stack at least comprising an organic electroluminescent layer
7 electrically conductive layer, second electrode
8 external power source
9 electroluminescent light
CC conductive component
EL organic electroluminescent device
E edge of the second opaque conductive areas 31 in contact to the transparent layer 2
SL shunt(ing) line
MS opaque conductive satellite, in the figures metal satellites
P step of providing
D step of depositing
C step of additionally exposing with light
IL step of illuminating
R step of removing
B step of heating
H step of hardening
DP deposition of the pattern of second opaque conductive areas
D-EL depositing a second layer stack on top of the first layer stack and the remaining photoresist layer
D-CL depositing an electrically conductive layer on top of the second layer stack

The invention claimed is:

1. Method for covering opaque conductive areas in a self-aligned process comprising the steps of
providing a transparent substrate at least partly covered with a first layer stack comprising at least one transparent layer, and a pattern of first and second opaque conductive areas deposited on top of the transparent layer,
depositing a photoresist layer made of an electrically insulating photoresist material on top of the first layer stack at least fully covering the second opaque conductive areas,
illuminating the photoresist layer through the transparent substrate with light of a suitable wavelength to make the photoresist material soluble in the areas of the photoresist layer having no opaque conductive areas underneath,
removing the soluble areas of the photoresist layer,
heating the areas of the photoresist layer remaining on top of at least the second opaque conductive areas to re-flow the photoresist layer to cover the edges of the second opaque conductive areas in contact to the transparent layer, and
hardening the remaining areas of the photoresist layer.

2. Method according to claim 1, wherein the step of depositing the photoresist layer is performed by slit coating, spin coating, slot-die coating, ink jet-printing, screen printing, gravure, or flexo printing.

3. Method according to claim 1, wherein the step of depositing the photoresist layer is performed by locally printing the photoresist layer on top of the second opaque conductive areas and parts of the transparent layer.

4. Method according to claim 1, wherein the method further comprises the step of additionally exposing the first opaque conductive areas with light in order to be able to remove the photoresist layer partly from the first opaque conductive areas.

5. Method according to claim 4, wherein the step of additionally exposing is performed by laser or masked exposure from the photoresist layer side.

6. Method according to claim 1, wherein the deposition of the pattern of second opaque conductive areas is performed by laser deposition or printing pattern of second opaque conductive areas directly on top of the transparent layer and/or by removing the second opaque conductive material locally from a second opaque conductive layer deposited on top of the transparent layer using laser ablation or etching.

7. Method according to claim 1, wherein the step of removing the developed areas of the photoresist layer is performed by a wet chemical resist strip process.

8. Method according to claim 1, wherein the step of heating is performed at peak temperatures above 100° C.

9. Method according to claim 8, wherein the duration of the heating step is adjusted in order to achieve a reflow of the photoresist layer suitable to cover an area of the transparent layer with extension of more than 100 nm around the edge of the second opaque conductive areas.

10. Method according to claim 8, wherein the step of hardening the remaining areas of the photoresist layer is performed simultaneously with the heating step.

11. The method according to claim 9, wherein the duration of the heating step is adjusted in order to achieve a reflow of the photoresist layer suitable to cover an area of the transparent layer with extension of between 200 nm and 1 µm.

12. Method according to claim 8, wherein the method further comprising the steps of
- depositing a second layer stack at least comprising an organic layer on top of the first layer stack and the remaining areas of the photoresist layer, and
- depositing an electrically conductive layer on top of the second layer stack in order to provide an organic thin film device.

13. The method of claim 1, wherein the at least one transparent layer is electrically conductive.

\* \* \* \* \*